United States Patent
Verma et al.

(10) Patent No.: US 6,936,519 B2
(45) Date of Patent: Aug. 30, 2005

(54) DOUBLE POLYSILICON BIPOLAR TRANSISTOR AND METHOD OF MANUFACTURE THEREFOR

(75) Inventors: Purakh Raj Verma, Singapore (SG); Shao-fu Sanford Chu, Singapore (SG)

(73) Assignee: Chartered Semiconductor Manufacturing, Ltd., Singapore (SG)

(*) Notice: Subject to any disclaimer, the term of this patent is extended or adjusted under 35 U.S.C. 154(b) by 317 days.

(21) Appl. No.: 10/224,111

(22) Filed: Aug. 19, 2002

(65) Prior Publication Data

US 2004/0033671 A1 Feb. 19, 2004

(51) Int. Cl.[7] .................................. H01L 21/8222
(52) U.S. Cl. .................. 438/309; 438/312; 438/361
(58) Field of Search ................ 438/309–327, 438/331–376

(56) References Cited

U.S. PATENT DOCUMENTS

| | | | |
|---|---|---|---|
| 4,903,104 A | 2/1990 | Kawai et al. ............... 357/35 |
| 5,365,090 A | * 11/1994 | Taka et al. ............... 257/197 |
| 5,494,836 A | 2/1996 | Imai ........................ 437/31 |
| 5,773,350 A | * 6/1998 | Herbert et al. ........... 438/364 |
| 6,169,007 B1 | 1/2001 | Pinter ..................... 438/320 |

OTHER PUBLICATIONS

E.Ohue, K. Oda, R. Hayami, and K. Washio, "A 7.7–ps CML Using Selective–Epitaxial SiGe HBTs", *Proc. IEEE BCTM*, pp. 97–100. 1998.

K. Washio, M. Kondo, E. Ohue, K. Oda, R. Hayami, M. Tanabe, H. Shimamoto, and T. Harada, "A 0.2–$\mu$m Self–Aligned SiGe HBT Featuring 107–GHz $f_{max}$ and 6.7–ps ECL", IEDM Tech Dig. Of Papers, pp. 557–560, 1999.

D.L. Harame, H.H. Comfort, J.D. Cressler, E.F. Crabbé, J. Y.–C. Sun, B.S. Meyerson, and T. Tice, "Si/SiGe Epitaxial–Base Transistors—Part I: Materials, Physics, and Circuits", IEEE Transactions on Electronic Devices, vol. 42, No. 3, pp. 455–468, Mar. 1995.

D.L. Harame, H.H. Comfort, J.D. Cressler, E.F. Crabbé, J. Y.–C. Sun, B.S. Meyersonn, and T. Tice, "Si/SiGe Epitaxial–Base Transistors—Part II: Process Integration and Analog Applications", IEEE Transactions on Electronic Devices, vol. 42, No. 3, pp. 469–482, Mar. 1995.

* cited by examiner

*Primary Examiner*—H. Jey Tsai
(74) *Attorney, Agent, or Firm*—Mikio Ishimaru

(57) ABSTRACT

A bipolar transistor, and manufacturing method therefor, with a substrate having a collector region and a base structure provided thereon. An emitter structure is formed over the base structure and an extrinsic base structure is formed over the base structure and over the collector region beside and spaced from the emitter structure. A dielectric layer is deposited over the substrate and connections are formed to the extrinsic base structure, the emitter structure and the collector region.

5 Claims, 4 Drawing Sheets

DOUBLE POLYSILICON BIPOLAR TRANSISTOR AND METHOD OF MANUFACTURE THEREFOR

BACKGROUND

1. Technical Field

The present invention relates generally to bipolar transistors and more specifically to double polysilicon bipolar transistors.

2. Background Art

Bipolar transistors were originally developed many years ago but were generally superceded by CMOS transistors, which consume less power and are less difficult to manufacture, and thus less expensive. Although a great deal of effort has been spent over the years improving bipolar transistors, they have not improved to the point where they are as popular as CMOS transistors.

Recently, demand for bipolar transistors has increased significantly because these transistors are capable of operating at higher speeds and driving more current than CMOS transistors. These characteristics are important for high-speed, high frequency communication networks such as those required by cell phones and computers.

Most bipolar transistors in use today are the so-called "double poly" bipolar transistors, which use a two polysilicon structures; one for an emitter structure and a second for a base structure.

The conventional bipolar transistor is difficult to manufacture and cost is a major problem. The transistor is manufactured by implanting a substrate with a dopant to provide a buried collector. An additional layer of silicon covers the implanted substrate. Insulating dividers called shallow-trench isolation (STI) are formed in the silicon substrate. The STI's define an intrinsic base region over a buried collector and a collector tap connected to the buried collector between two of the STI's and separated from the intrinsic base region.

Subsequently, a first layer of polysilicon is deposited over the upper silicon and is processed to form a base polysilicon structure in contact with the intrinsic base region. One portion of the base polysilicon structure is formed with an opening for an emitter polysilicon structure to be formed within.

A first insulating layer is deposited over the base polysilicon structure and is removed in the opening of the base polysilicon structure over the intrinsic base region by etching down to the substrate. The process inherently produces a rough surface on the substrate.

To get higher performance, silicon germanium is generally grown over the insulating layer and on the rough surface of the substrate. The rough surface causes a major problem because the silicon germanium growth is irregular and its thickness is not constant as a result of the roughness. This leads to performance problems with the device and differences from device to device.

The silicon germanium is processed to surround and cover the base polysilicon structure and a second insulating layer is grown over the silicon germanium. The second insulating layer is then removed over the silicon germanium on the intrinsic base region.

A second layer of polysilicon is deposited and processed to form an emitter polysilicon structure, which is encircled by and overlaps the base polysilicon structure. The overlap is necessary to provide room for an emitter contact, but it causes another major problem with unwanted capacitance between the emitter and base polysilicon structures. This capacitance slows down the operation of the bipolar transistor.

A spacer layer is deposited over the emitter polysilicon structure and is processed to form spacers around the emitter polysilicon structure. An interlayer dielectric layer is then deposited over the emitter and base polysilicon structures and the second insulating layer.

Finally, contacts are formed for the collector, the base, and the emitter.

The collector contact extends through the inner layer dielectric and the second insulating layer to the collector tap connected to the buried collector.

The base contact extends through the inner layer dielectric, the first insulating layer, the silicon germanium, and the second insulating layer, and into the base polysilicon structure.

The emitter contact extends through the inner layer dielectric into the emitter polysilicon structure. As previously mentioned, the emitter polysilicon structure overlaps the base polysilicon structure because it is necessary to provide room for the emitter contact. Since it is desirable to make the overlap as small as possible, it is desirable to have the emitter polysilicon structure as small as possible. However, this means that variations in the size of the emitter contact will lead to a further major problem referred to as emitter shadowing effect where the size of the emitter contact cause different current gains through the emitter polysilicon structure because the emitter dopant will be implanted at different depths. This effect causes performance variations in bipolar transistor current driving capability.

Despite many years of research and development, solutions to these problems have been long sought but have long eluded those skilled in the art.

DISCLOSURE OF THE INVENTION

The present invention provides a bipolar transistor, and a method of manufacturing therefor, with a substrate having a collector region and a base structure thereon. An emitter structure is formed over the base structure and an extrinsic base structure is formed over the base structure and over the collector region beside and spaced from the emitter structure. A dielectric layer is deposited over the substrate and connections are formed to the extrinsic base structure, the emitter structure and the buried collector. The bipolar transistor has faster operation, reduced size, consistent current driving capability, improved performance, and/or reduced cost over the prior art. The manufacturing method reduces the number of processing steps, provides for a smooth substrate over the intrinsic base region, reduces capacitance between the emitter and base structures, and eliminates emitter shadowing effect.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
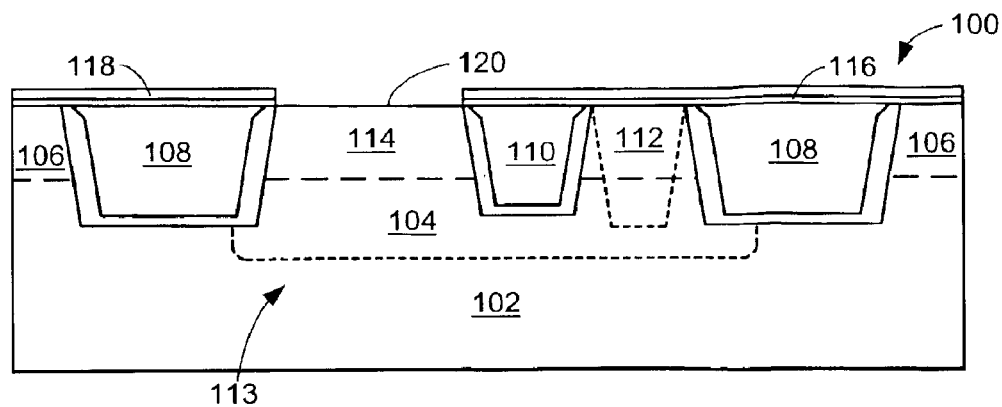
FIG. 1 is a cross-sectional view of a bipolar transistor in an intermediate stage of manufacture in accordance with the present invention.

Referring now to FIG. 1, therein is shown a cross-sectional view of a bipolar transistor 100 in an intermediate stage of manufacture in accordance with the present invention. A semiconductor substrate 102 has been implanted with a dopant to form a buried collector 104. An epitaxial layer 106 of substrate material has been deposited over the semiconductor substrate 102 and the buried collector 104.

The bipolar transistor 100 has also had insulating dividers formed into the semiconductor substrate 102 and the epitaxial layer 106 that are shallow trench isolations (STI's). First and second STI's 108 and 110 are on either side of a collector tap 112, which is connected to the buried collector 104, and which is a heavily doped implant in the epitaxial layer 106. The epitaxial layer 106 on the other side from the collector tap 112 has a lower concentration of a similar type of doping as that of the buried collector 104 and forms a sub collector region 114. Collectively, the buried collector 104, the collector tap 112, and the sub collector region 114 will be referred to as a collector region 113.

First and second thin dielectric layers 116 and 118 have been deposited over the epitaxial layer 106. The first and second thin dielectric layers 116 and 118, and have also been processed to expose a surface 120 over the sub collector region 114. The second thin dielectric layer 118 can be dry etched and the first thin dielectric layer 116 can be wet etched with high selectivity to the surface 120. This leaves the surface 120 extremely smooth with less than 20 Å variations and defect free.

The term "horizontal" as used in herein is defined as a plane parallel to the conventional plane or surface of a wafer or substrate, regardless of its orientation. The term "vertical" refers to a direction perpendicular to the horizontal as just defined. Terms, such as "on", "above", "below", "side" (as in "sidewall"), "higher", "lower", "over", and "under", are defined with respect to the horizontal plane. The term "beside" refers to two structures, which are side by side with neither overlapping the other.

The term "processing" as used herein includes deposition of material or photoresist, patterning, exposure, development, etching, cleaning, and/or removal of the material or photoresist as required in forming a described structure.

In one embodiment for an NPN transistor, the semiconductor substrate 102 is lightly P-doped and the sub collector region 114 is the semiconductor substrate 102 with lightly N− doped (5E16 to 8E17/cm$^3$). The buried collector 104 and the collector tap 112 have a N+ doping. The first and second STI's 108 and 110 can be conventional STI trenches with grown silicon oxide liners filled with deposited silicon oxide. The first and second thin dielectric layers 116 and 118 can be of silicon oxide and silicon nitride of a thickness less than about 600 Å.

Since a highly selective etch can be used to remove the silicon oxide from over the silicon substrate, the silicon substrate will be essentially unetched, which means that the surface 120 will be extremely smooth for later depositions.

Figure 2:
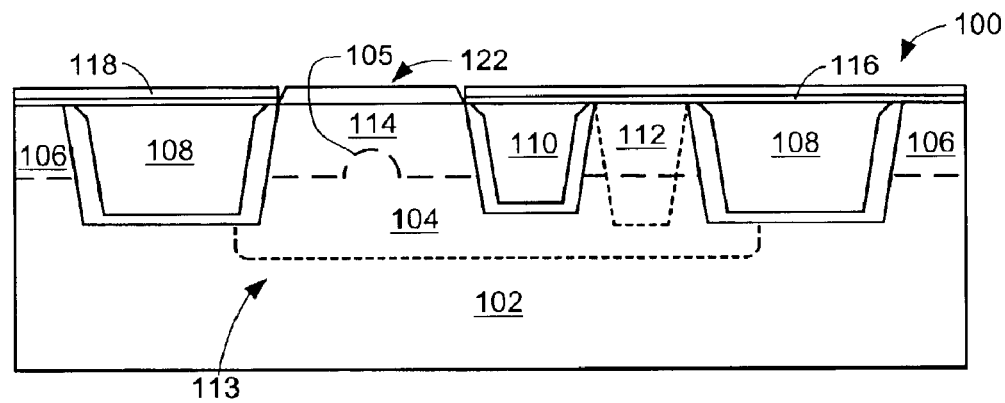
FIG. 2 is the structure of FIG. 1 after deposition and processing of a base material.

Referring now to FIG. 2, therein is shown the structure of FIG. 1 after deposition and processing of a base structure or base material 122. The base material 122 is grown over the surface 120, which is extremely smooth and defect free so as to result in a good base collector junction leakage property. In one embodiment, the base material 122 is silicon germanium, which greatly enhances the speed of the bipolar transistor 100.

Also shown in FIG. 2 is an optional selectively implanted collector (SIC) 105, which can be separately implanted to improve the performance of the bipolar transistor 100 by about 10%. The SIC 105 in one embodiment has a N+ doping.

Figure 3:
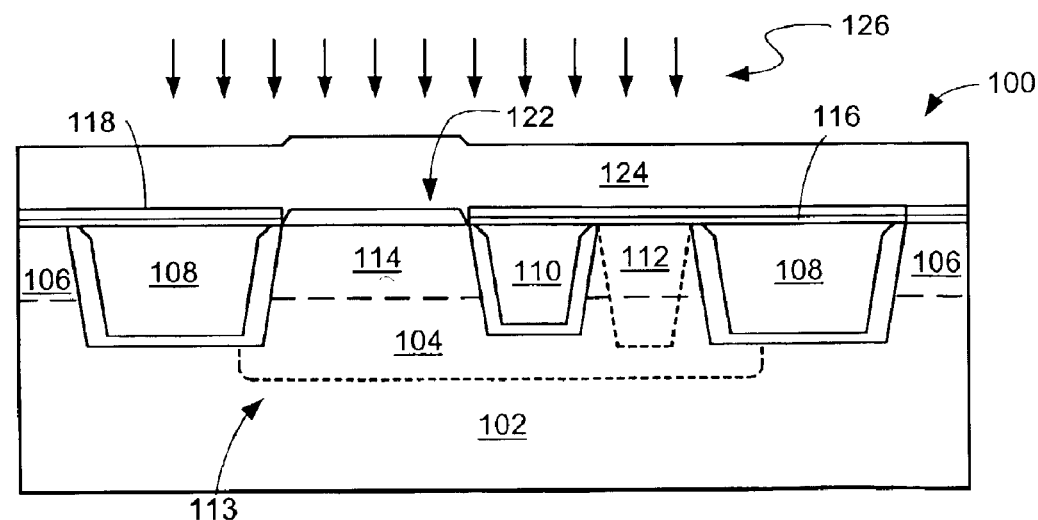
FIG. 3 is the structure of FIG. 2 after deposition of an emitter structure layer and during an emitter structure implant.

Referring now to FIG. 3, therein is shown the structure of FIG. 2 after deposition of an emitter structure layer 124 and during an emitter structure implant 126. In one embodiment, the emitter structure layer 124 is of polysilicon and the emitter structure implant 126 is of a N+ dopant.

Figure 4:
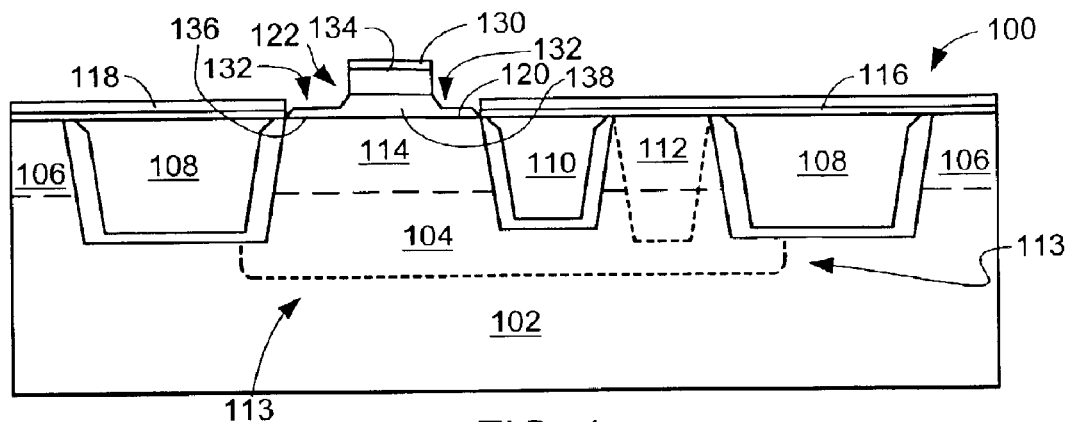
FIG. 4 is the structure of FIG. 3 after deposition of a third thin dielectric layer over the emitter structure layer and patterning of the emitter structure.

Referring now to FIG. 4, therein is shown the structure of FIG. 3 after deposition of a third thin dielectric layer over the emitter structure layer 124 of FIG. 3. The third thin dielectric layer and the emitter structure layer 124 have been processed to leave a CMP stop layer 130 over an emitter structure 134. In one embodiment, the CMP stop layer 130 has a thickness under about 1500 Å.

It should be noted that the base material 122 is slightly trenched at shoulders 132 beside the emitter structure 134. The shoulders 132 form an extrinsic base part 136 of the base material 122 beside the emitter structure 134 and integral with a thicker, intrinsic base part 138 of the base material 122 under the emitter structure 134. In the NPN example, the intrinsic base part 138 is moderately P− doped while the extrinsic base part 136 is heavily P− doped.

Figure 5:
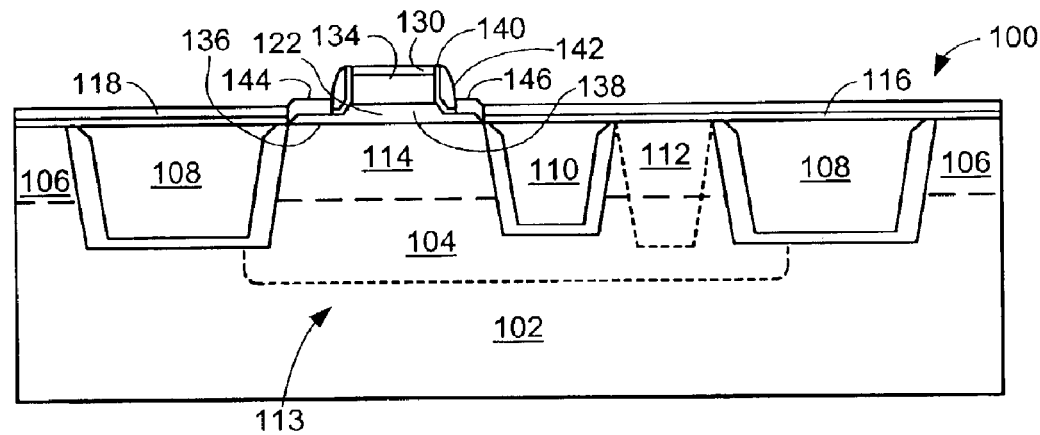
FIG. 5 is the structure of FIG. 4 after deposition of spacer layers and formation of the spacers around the emitter poly.

Referring now to FIG. 5, therein is shown the structure of FIG. 4 after deposition of two spacer layers and formation of first and second spacers 140 and 142 around the emitter structure 134. In one embodiment, the first and second spacer 140 and 142 will be of silicon oxide and silicon nitride.

Also shown in FIG. 5 is an optional a selective elevated source/drain 144 and 146. An epitaxial layer is deposited selectively to form the elevated source/drains 144 and 146. In one embodiment, the elevated source/drains 144 and 146 are heavily P− doped (1E19 to 1E20/cm$^3$). This has the advantage that the collector epitaxial layer can be thinner as the extrinsic base part 136 of the base material 122 gets lifted up.

Figure 6:
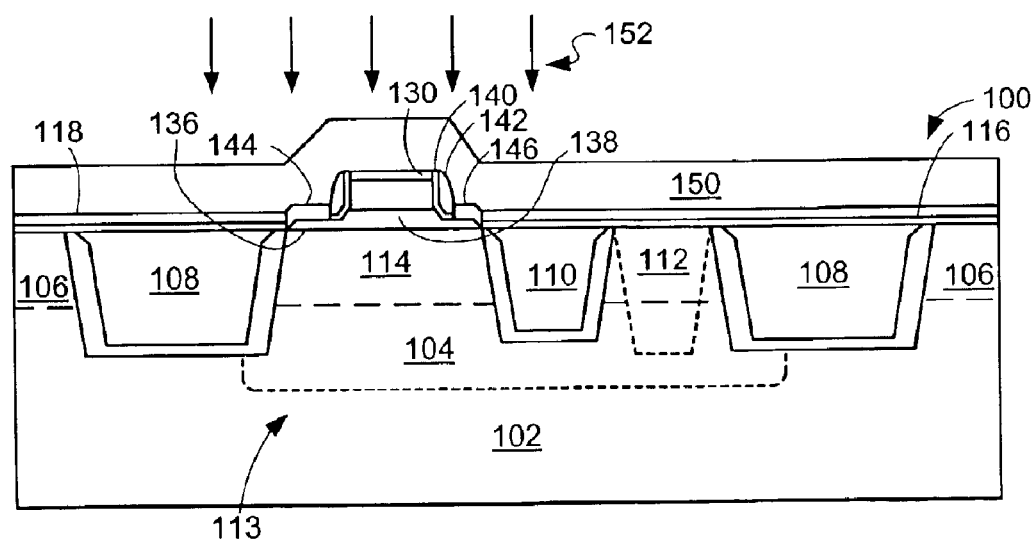
FIG. 6 is the structure of FIG. 5 after deposition of an extrinsic base structure layer and during a base structure implant.

Referring now to FIG. 6, therein is shown the structure of FIG. 5 after deposition of an extrinsic base structure layer 150 and during an extrinsic base structure implant 152. In one embodiment, the extrinsic base structure layer 150 is of polysilicon and the extrinsic base structure implant 152 is of a P+ dopant.

Figure 7:
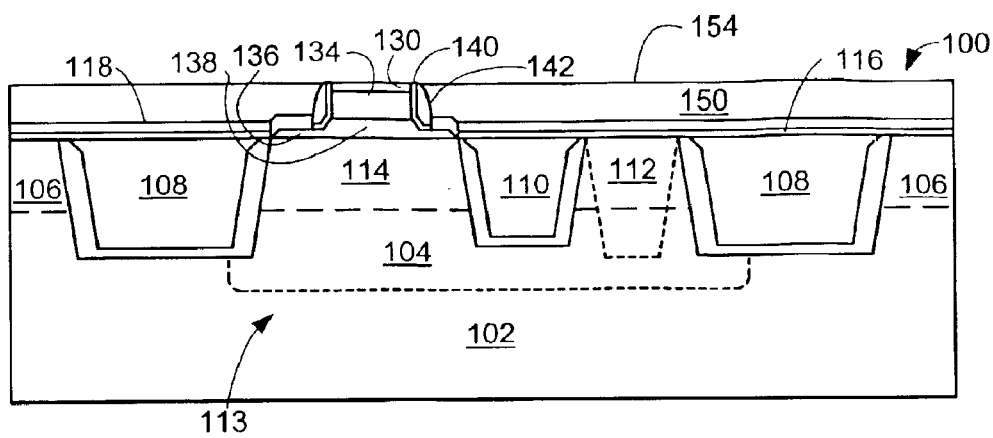
FIG. 7 is the structure of FIG. 6 after chemical mechanical polishing of the base structure layer.

Referring now to FIG. 7, therein is shown the structure of FIG. 6 after chemical mechanical polishing (CMP) of the extrinsic base structure layer 150. The CMP removes material from the extrinsic base structure layer 150 and stops on the CMP stop layer 130 to leave a top surface 154 of the extrinsic base structure layer 150 substantially coplanar with the top of the CMP stop layer 130.

Figure 8:
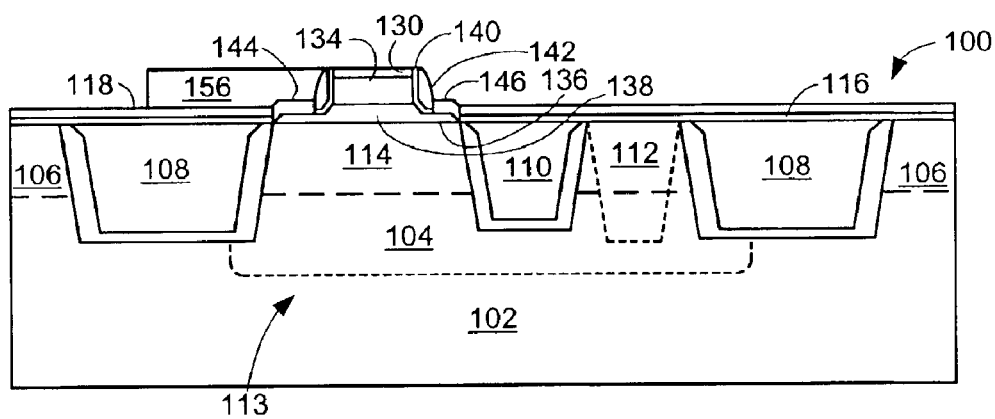
FIG. 8 is the structure of FIG. 7 after processing and patterning to form a base structure.

Referring now to FIG. 8, therein is shown the structure of FIG. 7 after processing the extrinsic base structure layer 150 to form an extrinsic base structure 156. The extrinsic base structure 156 is formed beside, and by definition not under, the emitter structure 134.

A rapid thermal anneal (RTA) is performed to drive dopant from the extrinsic base structure 156 into the optional selected elevated source/drains 144 and 146 and/or into the base material 122 to form the extrinsic base part 136 of the base material 122. The RTA also drives dopant from the emitter structure 134 into the base material 122 to form the intrinsic base part 138 of the base material 122 and a shallow emitter structure (not shown) in the intrinsic base part 138.

It should be noted that the extrinsic base structure 156 is formed only on one side of the emitter structure 134. It could be formed on both sides, but any advantage from having a lower base resistance costs area and results in some high frequency performance degradation. In the past, the extrinsic base structure generally surrounded the emitter structure, which resulted in a larger double polysilicon transistor size. The present invention also reduces the emitter-to-base structure and base-to-collector structure capacitances over the past structure.

Figure 9:
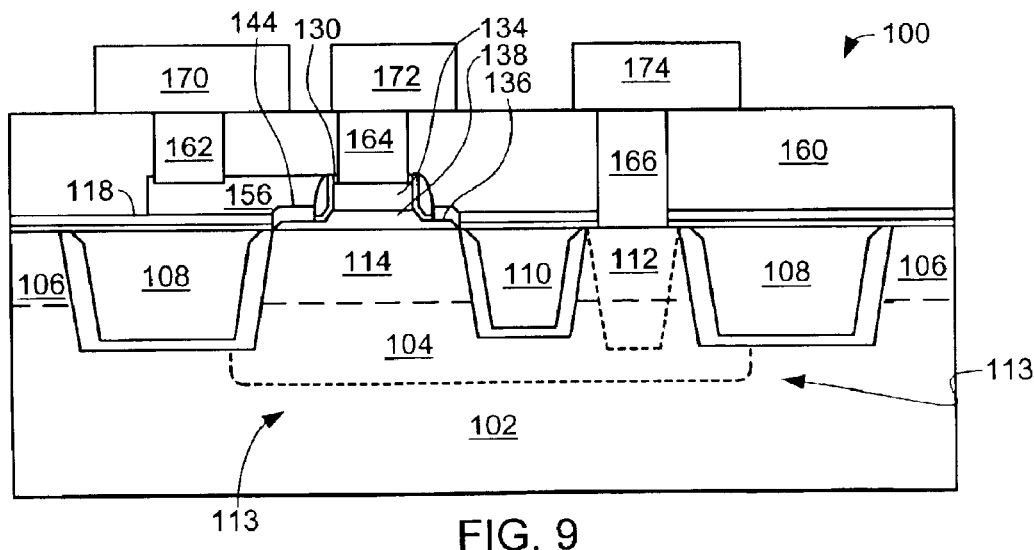
FIG. 9 is the structure of FIG. 8 as the completed double polysilicon bipolar transistor in accordance with the present invention.

Referring now to FIG. 9, therein is shown the bipolar transistor 100, completed according to the present invention. An interlevel dielectric (ILD) layer 160 has been deposited over the structure of FIG. 8. Openings in the ILD layer 160 have been made for the various contacts. A base contact 162 has been deposited through the ILD layer 160 into an over-etched part of the extrinsic base structure 156. An emitter contact 164 has been deposited through the ILD layer 160 through the CMP stop layer 130 into the emitter structure 134. A collector contact 166 has been deposited through the ILD layer 160 and the first and second thin dielectric layers 116 and 118 into contact with the collector tap 112.

Finally, a metal layer is deposited and processed to form base, emitter, and collector wires 170, 172, and 174 respectively connected to the base, emitter, and collector contacts 162, 164, and 166.

Figure 10:
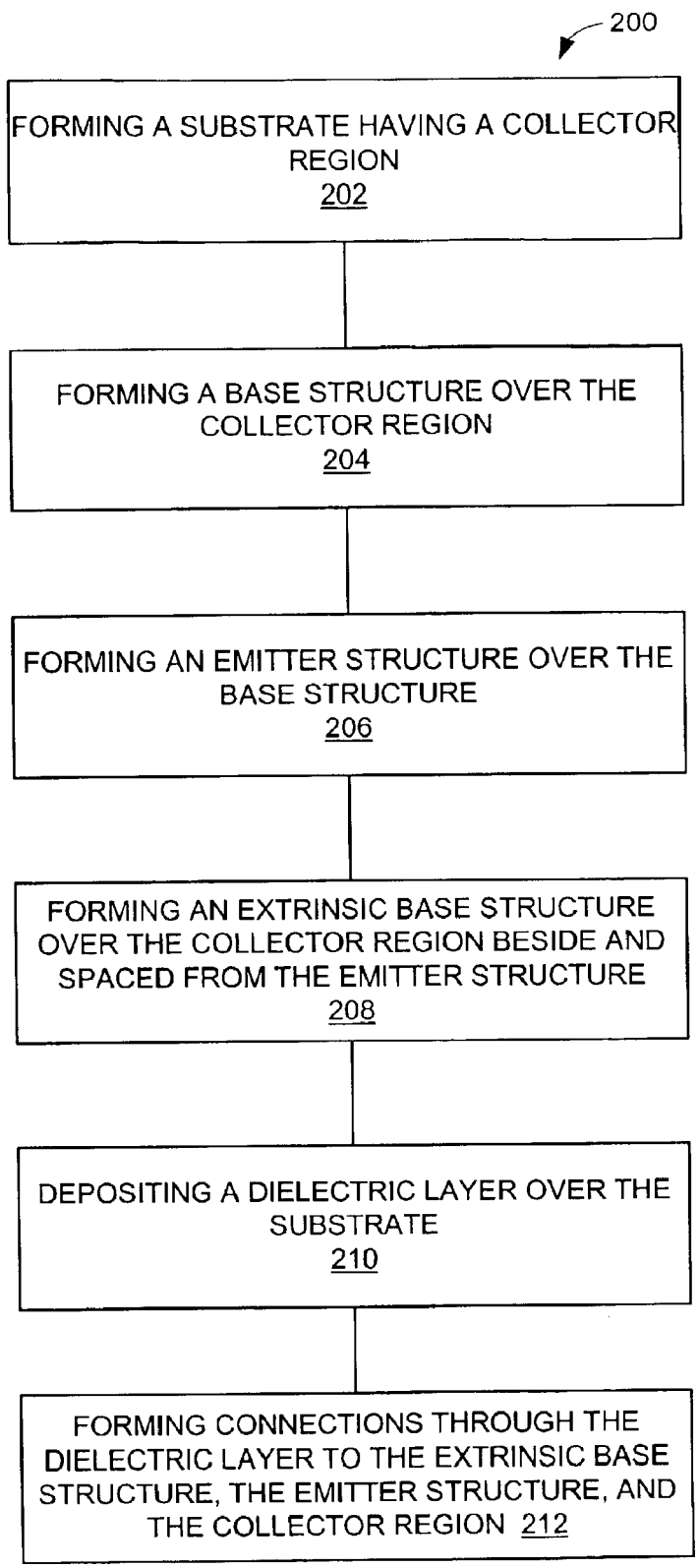
FIG. 10 is a simplified flow chart in accordance with the present invention.

Referring now to FIG. 10, therein is shown a simplified flow chart 200 in accordance with the present invention. The manufacturing method includes: a step 202 of forming a substrate having a collector region; a step 204 of forming a base structure over the collector region; a step 206 of forming an emitter structure over the base structure; a step 208 of forming an extrinsic base structure over the collector region beside and spaced from the emitter structure; a step 210 of depositing a dielectric layer over the substrate; and a step 212 of forming connections through the dielectric layer to the extrinsic base structure, the emitter structure, and the collector region.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters hither-to-fore set forth herein or shown in the accompanying drawings are to be interpreted in an illustrative and non-limiting sense.

The invention claimed is:

1. A method of manufacturing a bipolar transistor comprising:
    forming a substrate having a collector region;
    forming a base structure over the collector region;
    depositing a first polysilicon layer over the base structure;
    doping the first polysilicon layer to form an emitter polysilicon layer;
    depositing a thin dielectric layer over the emitter polysilicon layer;
    forming the emitter polysilicon layer to form an emitter structure having the thin dielectric layer over the emitter structure;
    forming a spacer around the emitter structure;
    depositing a second polysilicon layer over the emitter structure and the extrinsic base region;
    doping the second polysilicon layer to form a base polysilicon layer;
    planarizing the base polysilicon layer down to the first thin dielectric layer to remove the base polysilicon layer from over the emitter structure;
    forming the base polysilicon layer to form an extrinsic base structure over the collector region beside and spaced from the emitter structure by the spacer;
    depositing an interlayer dielectric layer over the substrate; and
    forming connections through the interlayer dielectric layer to the extrinsic base structure, the emitter structure, and the collector region.

2. The method as claimed in claim 1 wherein:
    forming the emitter structure is performed before forming the extrinsic base structure and after forming the base structure; and
    forming the extrinsic base structure includes:
        doping the base structure to form an extrinsic base part on the collector region of the substrate; and
        depositing the second polysilicon layer over the extrinsic base part.

3. The method as claimed in claim 1 additionally comprising:
    depositing first and second dielectric layers over the substrate;
    exposing the collector region through the first and second dielectric layers;
    forming silicon germanium over the collector region exposed through the first and second dielectric layers;
    forming an extrinsic base part of the silicon germanium using a rapid thermal anneal;
    and wherein:
    depositing the first polysilicon layer deposits the first polysilicon layer over the first and second dielectric layers and the silicon germanium;
    depositing the second polysilicon layer deposits the second polysilicon layer over the first polysilicon layer; and
    forming an intrinsic base part of the silicon germanium using the rapid thermal anneal.

4. The method as claimed in claim 1 wherein additionally comprising:
    forming a selective elevated source/drain as part of the extrinsic base structure and around the emitter structure and the spacer; and performing a rapid thermal anneal after forming the emitter structure and the extrinsic base structure.

5. The method as claimed in claim 1 wherein:
forming the substrate having a collector region includes:
   forming a collector tap,
   forming a buried collector, and
   forming a sub collector region; and additionally comprising:
   forming a selectively implanted collector in the sub collector region of the substrate.

\* \* \* \* \*